(12) United States Patent  
Sharma et al.

(10) Patent No.: US 8,617,641 B2  
(45) Date of Patent: Dec. 31, 2013

(54) COATED ARTICLE COMPRISING COLLOIDAL SILICA INCLUSIVE ANTI-REFLECTIVE COATING, AND METHOD OF MAKING THE SAME

(75) Inventors: Pramod K. Sharma, Ann Arbor, MI (US); Mark A. Lewis, Ypsilanti, MI (US)

(73) Assignee: Guardian Industries Corp., Auburn Hills, MI (US)

(*) Notice: Subject to any disclaimer, the term of this patent is extended or adjusted under 35 U.S.C. 154(b) by 914 days.

(21) Appl. No.: 12/591,225

(22) Filed: Nov. 12, 2009

(65) Prior Publication Data

US 2011/0108101 A1   May 12, 2011

(51) Int. Cl.
    *B05D 5/06* (2006.01)
(52) U.S. Cl.
    USPC .......................................................... 427/74
(58) Field of Classification Search
    USPC .......................................................... 427/74
    See application file for complete search history.

(56) References Cited

U.S. PATENT DOCUMENTS

| | | | |
|---|---|---|---|
| 3,094,436 A | 6/1963 | Schroder | |
| 4,510,344 A | 4/1985 | Berman | |
| 4,590,117 A * | 5/1986 | Taniguchi et al. | 428/212 |
| 4,792,536 A | 12/1988 | Pecoraro et al. | |
| 4,806,436 A | 2/1989 | Tada et al. | |
| 4,816,333 A | 3/1989 | Lange et al. | |
| 4,830,879 A | 5/1989 | Debsikdar | |
| 5,214,008 A | 5/1993 | Beckwith et al. | |
| 5,308,805 A | 5/1994 | Baker et al. | |
| 5,401,287 A | 3/1995 | Pecoraro et al. | |
| 5,449,413 A | 9/1995 | Beauchamp et al. | |
| 5,480,722 A | 1/1996 | Tomonaga et al. | |
| 5,744,227 A | 4/1998 | Bright et al. | |
| 5,750,797 A | 5/1998 | Vitcak et al. | |
| 5,783,049 A | 7/1998 | Bright et al. | |
| 5,830,252 A | 11/1998 | Finley et al. | |
| 5,883,030 A | 3/1999 | Bako et al. | |
| 5,948,131 A | 9/1999 | Neuman | |
| 5,964,962 A | 10/1999 | Sannomiya et al. | |

(Continued)

FOREIGN PATENT DOCUMENTS

| | | |
|---|---|---|
| DE | 100 51 725 | 5/2002 |
| DE | 103 29 917 | 2/2005 |

(Continued)

OTHER PUBLICATIONS

U.S. Appl. No. 11/122,218, filed May 5, 2005.

(Continued)

*Primary Examiner* — Robert Vetere  
(74) *Attorney, Agent, or Firm* — Nixon & Vanderhye P.C.

(57) ABSTRACT

Certain example embodiments of this invention relate to coated articles that include anti-reflective (AR) coatings produced from colloidal silica with variable size particles in formulation, and/or methods of making the same. In certain example embodiments, the AR coatings advantageously exhibit high transmission, high transmission gain with respect to uncoated articles, and high b* values, before and/or after heat treatment. The AR coatings of certain example embodiments may be temperable or otherwise heat treatable (e.g., at temperatures of 500 degrees C. or greater) together with their supporting substrates. In certain example embodiments, the particle size for the colloidal silica is 10-110 nm, and the b* values are at least about 0.8. Certain example embodiments may be used in connection with photovoltaic devices and/or the like.

6 Claims, 2 Drawing Sheets

(56) References Cited

U.S. PATENT DOCUMENTS

| | | | |
|---|---|---|---|
| 5,977,477 | A | 11/1999 | Shiozaki |
| 6,123,824 | A | 9/2000 | Sano et al. |
| 6,177,131 | B1 | 1/2001 | Glaubitt et al. |
| 6,288,325 | B1 | 9/2001 | Jansen et al. |
| 6,342,097 | B1 | 1/2002 | Terry et al. |
| 6,362,121 | B1 | 3/2002 | Chopin et al. |
| 6,372,327 | B1 | 4/2002 | Burnham et al. |
| 6,395,331 | B1 | 5/2002 | Yan et al. |
| 6,403,509 | B2 | 6/2002 | Cochran et al. |
| 6,407,021 | B1 | 6/2002 | Kitayama et al. |
| 6,495,482 | B1 | 12/2002 | de Sandro et al. |
| 6,498,118 | B1 | 12/2002 | Landa et al. |
| 6,503,860 | B1 | 1/2003 | Dickinson et al. |
| 6,506,622 | B1 | 1/2003 | Shiozaki |
| 6,521,558 | B2 | 2/2003 | Landa et al. |
| 6,538,084 | B2 | 3/2003 | Kitahara et al. |
| 6,573,207 | B2 | 6/2003 | Landa et al. |
| 6,576,349 | B2 | 6/2003 | Lingle et al. |
| 6,610,622 | B1 | 8/2003 | Landa et al. |
| 6,613,603 | B1 | 9/2003 | Sano |
| 6,716,780 | B2 | 4/2004 | Landa et al. |
| 6,723,211 | B2 | 4/2004 | Lingle et al. |
| 6,749,941 | B2 | 6/2004 | Lingle |
| 6,776,007 | B2 | 8/2004 | Hirota et al. |
| 6,784,361 | B2 | 8/2004 | Carlson et al. |
| 6,787,005 | B2 | 9/2004 | Laird et al. |
| 6,796,146 | B2 | 9/2004 | Burnham |
| 6,846,760 | B2 | 1/2005 | Siebers et al. |
| 6,863,518 | B2 | 3/2005 | Powers |
| 6,887,575 | B2 | 5/2005 | Neuman et al. |
| 6,921,578 | B2 | 7/2005 | Tsujino et al. |
| 6,936,347 | B2 | 8/2005 | Laird et al. |
| 6,974,630 | B1 | 12/2005 | Stachowiak |
| 7,081,302 | B2 | 7/2006 | Lemmer et al. |
| 7,241,505 | B2 | 7/2007 | Glaubitt et al. |
| 2001/0031811 | A1 | 10/2001 | Li et al. |
| 2002/0090519 | A1 | 7/2002 | Kursawe et al. |
| 2002/0122962 | A1 | 9/2002 | Arfsten et al. |
| 2003/0008155 | A1 | 1/2003 | Hayashi et al. |
| 2004/0028918 | A1 | 2/2004 | Becker et al. |
| 2004/0043260 | A1 | 3/2004 | Nadaud et al. |
| 2004/0058079 | A1 | 3/2004 | Yamada et al. |
| 2004/0121896 | A1 | 6/2004 | Landa et al. |
| 2004/0140001 | A1 | 7/2004 | Hammerbacher et al. |
| 2004/0209757 | A1 | 10/2004 | Landa et al. |
| 2004/0248995 | A1 | 12/2004 | Glaubitt et al. |
| 2004/0258611 | A1 | 12/2004 | Barrow et al. |
| 2004/0258929 | A1 | 12/2004 | Glaubitt et al. |
| 2005/0118749 | A1 | 6/2005 | Sakamoto et al. |
| 2005/0195486 | A1 | 9/2005 | Sasaki et al. |
| 2006/0019114 | A1 | 1/2006 | Thies et al. |
| 2006/0062902 | A1 | 3/2006 | Sager et al. |
| 2006/0099407 | A1 | 5/2006 | Wang et al. |
| 2007/0030569 | A1 | 2/2007 | Lu et al. |
| 2007/0074757 | A1* | 4/2007 | Mellott et al. ............... 136/256 |
| 2007/0113881 | A1 | 5/2007 | Mellott et al. |
| 2007/0116966 | A1 | 5/2007 | Mellott et al. |
| 2007/0295381 | A1* | 12/2007 | Fujii et al. ............... 136/244 |
| 2008/0072956 | A1* | 3/2008 | Sharma et al. ............... 136/256 |
| 2008/0169021 | A1 | 7/2008 | Krasnov |
| 2008/0308147 | A1 | 12/2008 | Lu et al. |
| 2009/0020157 | A1 | 1/2009 | Krasnov et al. |
| 2009/0032098 | A1 | 2/2009 | Lu |

FOREIGN PATENT DOCUMENTS

| | | |
|---|---|---|
| DE | 10 2005 020 168 | 11/2006 |
| EP | 0 482 821 | 4/1992 |
| EP | 1 167 313 | 1/2002 |
| EP | 1 329 433 | 7/2003 |
| EP | 1 873 126 | 1/2008 |
| JP | 07-122764 | 5/1995 |
| JP | 11-60269 | 3/1999 |
| WO | WO 91/04512 | 4/1991 |
| WO | WO 02/24971 | 3/2002 |
| WO | WO 2006114321 | 11/2006 |
| WO | WO 2007/044295 | 4/2007 |
| WO | WO 2008/112047 | 9/2008 |

OTHER PUBLICATIONS

U.S. Appl. No. 11/049,292, filed Feb. 3, 2005.
"Colored Glasses" Weyl; The Society of Glass Technology 1951, (4pgs).
"Colour Generation and Control in Glass", Bamford, Glass Science and Technology , 2, 1977 (3pgs).
"Photovoltaic Module Performance and Durability Following Long-Term Field Exposure", King et al., Sandia National Laboratories, (19pgs).
"Antireflection of Glazings for Solar Energy Applications", Nostell et al., Solar Energy Materials and Solar Cells 54 (1988) pp. 223-233.
"Anti-reflection (AR) Coatings Made by Sol-Gel Process: A Review", Chen, Solar Energy Materials and Solar Cells 68 (2001) pp. 313-336.
"Silica Antireflective Films on Glass Produced by the Sol-Gel Method", Bautista et al., Solar Energy Materials and Solar Cells 80 (2003) pp. 217-225.
"Synthesis and Characterization of Hydrophilic Nanocomposite Coating on Glass Substrate", Rahimi et al., Journal of Applied Polymer Science, vol. 102, 5322-5329 (2006).
"Method for the Preparation of Porous Silica Antireflection Coatings Varying in Refractive Index from 1.22 to 1.44", Thomas, Applied Optics, vol. 31, No. 28, Oct. 1, 1992.
Yoldas, B.E., O'Keeffe, T.W., "Antireflective Coatings Applied from Metal-Organic Derived Liquid Precursors," Applied Optics, vol. 18, No. 18, Sep. 15, 1979.
Sakka, Sumio, Handbook of Sol-gel Science and Technology: Sol-gel Processing, Springer, 2005.
U.S. Appl. No. 11/701,541, filed Feb. 2, 2007.
U.S. Appl. No. 11/790,813, filed Apr. 27, 2007.
Handbook of Science and Photovoltaic Engineering, 2003, John Wiley & Sons, Ltd. ISBN 0-471-49196-9, p. 62.
"Solar Energy Technologies Program: Polycrystalline Thin Film," Energy Efficiency and Renewable Energy, U.S. Department of Energy, http://www1.eere.energy.gov/solar/tf_polycrystalline.html, Content Last Updated Jan. 6, 2006.
Machine Translation of WO 2006/114321. Bewig, Lars et al. (Nov. 2006).
U.S. Appl. No. 11/878,790, filed Jul. 26, 2007.
U.S. Appl. No. 11/882,759, filed Aug. 3, 2007.
U.S. Appl. No. 11/902,072, filed Sep. 18, 2007.
U.S. Appl. No. 11/987,129, filed Nov. 27, 2007.
U.S. Appl. No. 11/976,079, filed Oct. 19, 2007.
U.S. Appl. No. 11/976,320, filed Oct. 23, 2007.
U.S. Appl. No. 12/000,319, filed Dec. 11, 2007.
International Search Report dated Dec. 11, 2008.
"Thermal Stability of Self-Assembled Octadecyltrichlorosilane Monolayers on Planar and Curved Silica Surfaces", Kulkarni et al., Thin Solid Films 496 (2006) 420-425.
"Formation of OTS Self-Assembled Monolayer on Glass Surface Investigated by AFM", Guo-Hua, Journal of Zhejiang University Science, 2000 vol. 1 No. 2 p. 162-170.
"Robust Self-Assembled Octadecytphosphonic Acid Monolayers on a Mica Substrate", Nie et al., 2005 American Chemical Society, p. 2773-2778.
CEI/IEC 61215 (Apr. 2005).
Academic Press Dictionary of Science and Technology, 1992, Academic Press.
European Search Report dated Feb. 9, 2009.
International Search Report dated Jan. 28, 2009.
U.S. Appl. No. 12/285,374, filed Oct. 2, 2008.
U.S. Appl. No. 12/285,890, filed Oct. 15, 2008.

\* cited by examiner

COATED ARTICLE COMPRISING COLLOIDAL SILICA INCLUSIVE ANTI-REFLECTIVE COATING, AND METHOD OF MAKING THE SAME

FIELD OF THE INVENTION

Certain example embodiments of this invention relate to photovoltaic devices and/or methods of making the same. More particularly, certain example embodiments of this invention relate to photovoltaic devices that include anti-reflective (AR) coatings produced from colloidal silica with variable size particles in formulation, and/or methods of making the same. In certain example embodiments, the AR coatings advantageously exhibit high transmission, high transmission gain with respect to uncoated articles, and high b* values, before and/or after heat treatment. The AR coatings of certain example embodiments may be temperable or otherwise heat treatable together with their supporting substrates.

BACKGROUND AND SUMMARY OF EXAMPLE EMBODIMENTS OF THE INVENTION

Glass is desirable for numerous properties and applications, including optical clarity and overall visual appearance. For some example applications, certain optical properties (e.g., light transmission, reflection and/or absorption) are desired to be optimized. For example, in certain example instances, reduction of light reflection from the surface of a glass substrate may be desirable for storefront windows, display cases, photovoltaic devices (e.g., solar cells), picture frames, other types of windows, and so forth.

Photovoltaic devices such as solar cells (and modules therefor) are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be of glass, and the photoelectric transfer film (typically semiconductor) is for converting solar energy to electricity. Example solar cells are disclosed in U.S. Pat. Nos. 4,510,344; 4,806,436; 5,977,477; 6,123,824; 6,288,325; 6,506,622; 6,613,603; and 6,784,361, and JP 07-122764, the disclosures of which are hereby incorporated herein by reference.

Substrate(s) in a solar cell/module are sometimes made of glass. Incoming radiation passes through the incident glass substrate of the solar cell before reaching the active layer(s) (e.g., photoelectric transfer film such as a semiconductor) of the solar cell. Radiation that is reflected by the incident glass substrate does not make its way into the active layer(s) of the solar cell, thereby resulting in a less efficient solar cell. In other words, it would be desirable to decrease the amount of radiation that is reflected by the incident substrate, thereby increasing the amount of radiation that makes its way to the active layer(s) of the solar cell. In particular, the power output of a solar cell or photovoltaic (PV) module may be dependant upon the amount of light, or number of photons, within a specific range of the solar spectrum that pass through the incident glass substrate and reach the photovoltaic semiconductor.

Because the power output of the module may depend upon the amount of light within the solar spectrum that passes through the glass and reaches the PV semiconductor, certain attempts have been made in an attempt to boost overall solar transmission through the glass used in PV modules. One attempt is the use of iron-free or "clear" glass, which may increase the amount of solar light transmission when compared to regular float glass, through absorption minimization.

In certain example embodiments of this invention, an attempt to address the aforesaid and/or other problem(s) is made using an antireflective (AR) coating on a glass substrate (the AR coating may be provided on either side of the glass substrate in different embodiments of this invention). An AR coating may increase transmission of light through the light incident substrate, and thus the power of a PV module in certain example embodiments of this invention.

Certain example embodiments of this invention relate to a method of making a coated article. A glass substrate is provided. A sol is prepared, with the sol comprising colloidal silica having a particle size of 10-110 nm. The sol is spin coated, directly or indirectly, onto the glass substrate. The sol is cured to form a silica-inclusive anti-reflective (AR) coating. The glass substrate together with the AR coating is heat treated at a temperature of at least about 500 degrees C. Oost heat treatment, the AR coating has a b* value of 0.8 or greater.

In certain example embodiments, the preparing of the silica sol comprises: (1) preparing a polymeric component, the polymeric component comprising n-propanol, Glycydoxyl-propyltrimethoxysilane (Glymo), water, and hydrochloric acid; (2) mixing the polymeric component; (3) forming a coating solution by combining the polymeric solution with the colloidal silica in methyl ethyl ketone; and (4) stirring the coating solution to form the silica sol.

In certain example embodiments, the glass substrate together with the AR coating is built into a photovoltaic device or another suitable electronic device.

Certain example embodiments of this invention relate to a method of making a solar cell. A glass substrate is provided. A sol comprising colloidal silica having a particle size of 10-110 nm is spin coated, directly or indirectly, onto the glass substrate. The sol is cured to form a silica-inclusive anti-reflective (AR) coating. The glass substrate together with the AR coating is heat treated at a temperature of at least about 500 degrees C. Post heat treatment, the AR coating has a b* value of 0.8 or greater and the AR coating provides a visible transmission gain of at least about 2.5% relative to the glass substrate alone.

In certain example embodiments, the curing comprises exposing the substrate together with the sol spin coated thereon to first and second elevated temperatures, the second elevated temperature being higher than the first elevated temperature.

Certain example embodiments of this invention relate to a coated article comprising a heat treated glass substrate and an AR coating spin coated from a sol comprising colloidal silica having a particle size of 10-110 nm, directly or indirectly, onto the substrate. The AR coating has a b* value of 0.8 or greater, and the AR coating provides a visible transmission gain of at least about 2.5% relative to the glass substrate alone.

In certain example embodiments, the colloidal silica particles may be uniformly or substantially uniformly sized. In certain example embodiments, the colloidal silica particles may be differently sized with respect to one another.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments of this invention relate to antireflective (AR) coatings that may be provided for in coated articles used in devices such as photovoltaic devices, storefront windows, display cases, picture frames, other types of windows, and the like. In certain example embodiments (e.g., in photovoltaic devices), the AR coating may be provided on either the light incident side or the other side of a substrate (e.g., glass substrate), such as a front glass substrate of a photovoltaic device.

Although described in connection with an AR coating on a glass substrate, it should be understood that certain embodiments of the present invention relate to silica coatings for silicon wafers and other polymeric substrates (e.g., plastics, like polycarbonates and/or acrylics).

In certain example embodiments of this invention, an improved anti-reflection (AR) coating is provided on an incident glass substrate of a solar cell or the like. This AR coating may function to reduce reflection of light from the glass substrate, thereby allowing more light within the solar spectrum to pass through the incident glass substrate and reach the photovoltaic semiconductor so that the solar cell can be more efficient. In other example embodiments of this invention, such an AR coating is used in applications other than photovoltaic devices (e.g., solar cells), such as in storefront windows, display cases, picture frames, greenhouse glass/windows, solariums, other types of windows, and the like. The glass substrate may be a glass superstrate or any other type of glass substrate in different instances.

Figure 1:
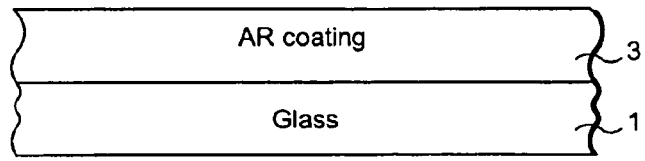
FIG. 1 is a cross-sectional view of a coated article including an antireflective (AR) coating made in accordance with an example embodiment of this invention (this coated article of FIG. 1 may be used in connection with a photovoltaic device or in any other suitable application in different embodiments of this invention)

Referring now more particularly to the drawings in which like reference numerals indicate like parts throughout the several views, FIG. 1 is a cross sectional view of a coated article according to an example embodiment of this invention. The coated article of FIG. 1 includes a glass substrate 1 and an AR coating 3.

In certain example embodiments of this invention, high transmission low-iron glass may be used for glass substrate 1 in order to further increase the transmission of radiation (e.g., photons) to the active layer of the solar cell or the like. For example and without limitation, the glass substrate 1 may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of anti-reflective coatings produced in accordance with the present invention may increase transmission of light to the active semiconductor film of the photovoltaic device.

Certain glasses for glass substrate 1 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4$x $7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 1 below (in terms of weight percentage of the total glass composition):

TABLE 1

Example Additional Materials In Glass

| Ingredient | General (Wt. %) | More Preferred | Most Preferred |
| --- | --- | --- | --- |
| Total iron (expressed as $Fe_2O_3$): | 0.001-0.06% | 0.005-0.04% | 0.01-0.03% |
| Cerium oxide: | 0-0.30% | 0.01-0.12% | 0.01-0.07% |
| $TiO_2$: | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the glass substrate 1 may be flat or patterned in different example embodiments of this invention.

Figure 2:
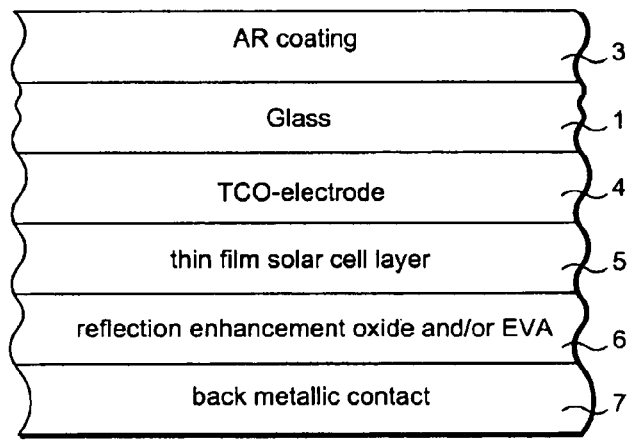
FIG. 2 is a cross sectional view of a photovoltaic device that may use the example AR coating of FIG. 1, in accordance with an example embodiment.

FIG. 2 is a cross-sectional view of a photovoltaic device (e.g., solar cell), for converting light to electricity, according to an example embodiment of this invention. The solar cell of FIG. 2 uses the AR coating 3 and glass substrate 1 shown in FIG. 1 in certain example embodiments of this invention. In this example embodiment, the incoming or incident light from the sun or the like is first incident on the AR coating 3, passes therethrough and then through glass substrate 1 and front transparent electrode 4 before reaching the photovoltaic semiconductor (active film) 5 of the solar cell. Note that the solar cell may also include, but does not require, a reflection enhancement oxide and/or EVA film 6, and/or a back metallic contact and/or reflector 7 as shown in example FIG. 2. Other types of photovoltaic devices may of course be used, and the FIG. 2 device is merely provided for purposes of example and understanding. As explained above, the AR coating 3 reduces reflections of the incident light and permits more light to reach the thin film semiconductor film 5 of the photovoltaic device thereby permitting the device to act more efficiently.

While certain of the AR coatings 3 discussed above are used in the context of the photovoltaic devices/modules, this invention is not so limited. AR coatings according to this invention may be used in other applications such as for picture frames, fireplace doors, and the like.

Also, other layer(s) may be provided on the glass substrate under the AR coating so that the AR coating is considered on the glass substrate even if other layers are provided therebetween. Also, while the AR coating 3 is directly on and contacting the glass substrate 1 in the FIG. 1 embodiment, it is possible to provide other layer(s) between the glass substrate and the AR coating in alternative embodiments of this invention. For example, certain embodiments of the present invention relate to the use of coatings in an arrangement of low index, high index, and/or medium index coatings. In some preferred embodiments, there is a low index coating on the light incident side of a substrate, and there is a high index coating (such as, for example, a ceria-titania-silica coating) and optionally a medium index coating between the substrate and the low index coating. The silica coatings in accordance with certain embodiments may be useful for a variety of applications, such as sodium ion barrier coatings, as a layer in multilayer AR coatings etc.

Set forth below is a description of how AR coating 3 may be made according to certain example non-limiting embodiments of this invention.

Porous silica has been used as an AR coating for certain glass applications. In the production of AR coatings, one desirable cosmetic feature involves the blue coloration that appears after curing in the oven and/or tempering in the furnace. Although this blue color provides an aesthetically pleasing look, e.g., for solar panels made with AR-coated glass, it will be appreciated that it would be desirable to provide high performance. Accordingly, certain example embodiments relate to the formulation or AR coatings that exhibit high performance and desirable cosmetic qualities. In particular, in certain example embodiments, colloidal silica with variable size particles in a formulation may be used to improve the performance and appearance of the AR coating on the glass that occurs before and/or after heat treatment (e.g., thermal tempering). The following examples are made using differently sized colloidal particles in the coatings. It will be appreciated that other formulations may be used in connection with different embodiments of this invention. For instance, although the examples described herein involve uniform or substantially uniformly sized particles within each example, different embodiments of the formulations may use differently sized particles to achieve the same or similar performance values and/or cosmetic qualities, e.g., by providing particles that have, on average, sizes within the ranges provided herein.

Table 2 is an overview of certain physical, optical, and performance values for the three examples described in greater detail below. In particular, Table 2 provides the particle sizes, coating thicknesses, transmission values, and transmission gains with respect to uncoated glass sheets for the three examples described in greater detail below. It will be appreciated that particle size refers to the diameter or width dimension of the particles and that thickness refers to the average thickness of the coating. It will be appreciated that because colloidal silica is sued, the performance (at least in terms of optical and durability performance, for example) of the coating may depend upon the size as well as the morphology of the colloidal elements. For example, large particles size may in certain example instances provide for increases in light scattering and/or help control the color of the optical coatings. As another example, in certain embodiments, large particle sizes for silica colloids may increase the transmission of AR coating by, for instance, creating a rougher surface, a more porous film, etc. As shown in the table below, the transmission range may be widened, e.g., by providing for gains of 2.5-3.0% in certain example embodiments.

TABLE 2

Phyiscal, Optical, and Performance Values of Example AR Coatings

| | Particle Size (nm) | Thickness (nm) | Transmission (%) | Transmission Gain (%) |
|---|---|---|---|---|
| Example 1 | 15 | 128.9 | 86.7 | 2.6 |
| Example 2 | 23 | 134 | 86.9 | 2.8 |
| Example 3 | 100 | 130 | 87.1 | 2.9 |

Figure 3:
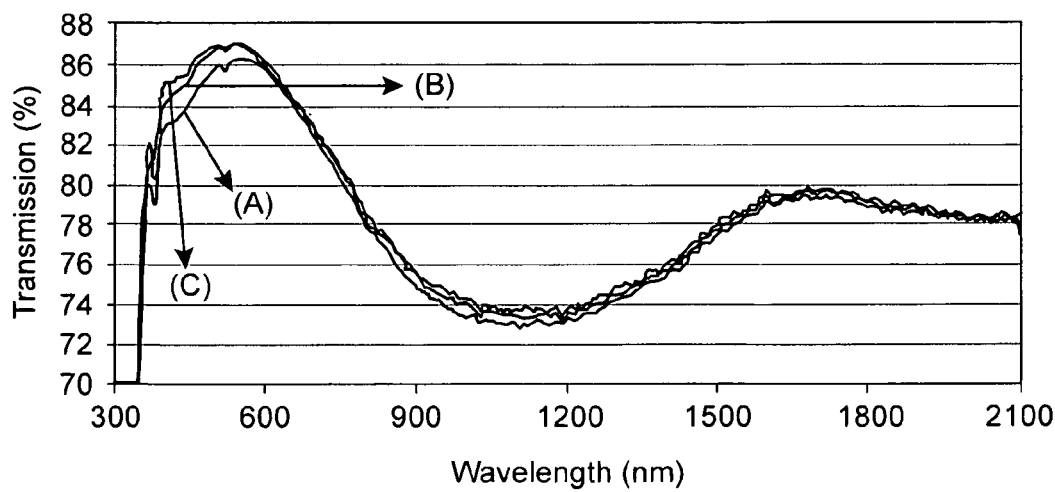
FIG. 3 is a graph that plots, the transmission across the optical spectrum for Examples 1, 2, and 3.
Figure 4:
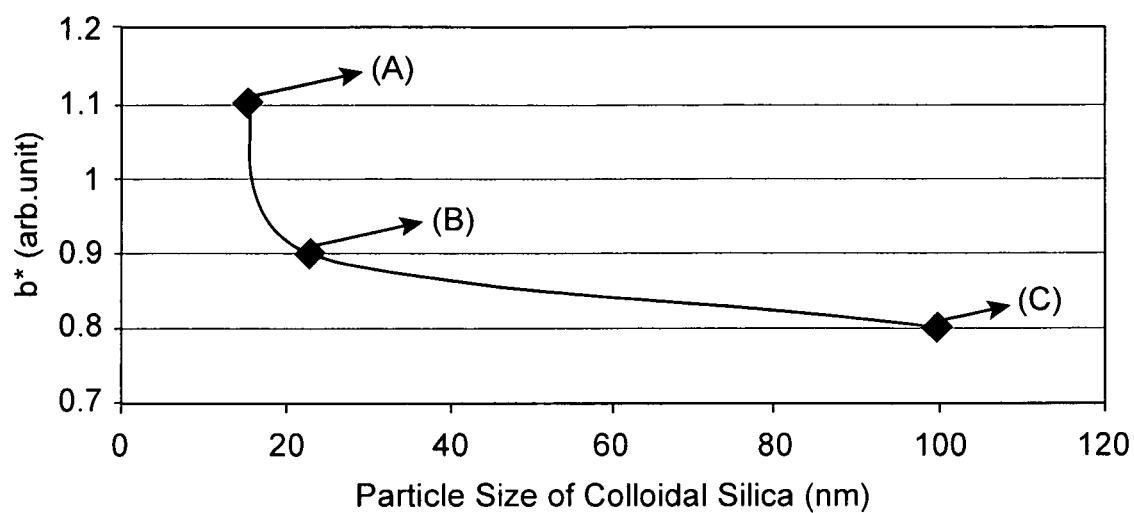
FIG. 4 is a graph that plots the b* value vs. particle size for the colloidal silica used in Examples 1, 2, and 3.

FIG. 3 is a graph that plots the transmission across the optical spectrum for Examples 1, 2, and 3, and FIG. 4 is a graph that plots the b* value vs. particle size for the colloidal silica used in Examples 1, 2, and 3. It will be appreciated from FIG. 4 that the b* values are quite high (indicating an intense bluish tint) for smaller particle sizes (e.g., particle sizes less than about 15 nm). The b* values drop quickly from about 15-20 nm, and decrease at a slower rate from about 20-100 nm or higher. Although certain examples are described in detail below, it will be appreciated that different embodiments of this invention may vary from the examples. For example, the particle size may vary, for example, from 10 nm-110 nm in certain example embodiments. In certain example embodiments, the transmission gain with respect to an uncoated glass substrate preferably is at least 2.5%, more preferably at least 2.7%, still more preferably at least 2.9%, and sometimes 3.0% or more. Visible transmission in certain example embodiments preferably is at least 85% and sometimes even higher than 87% or 90%. Additionally, in certain example embodiments, b* values preferably are 0.7-1.2, more preferably 0.8-1.1.

EXAMPLE 1

The silica sol for Example 1 was prepared as follows. A polymeric component of silica was prepared using 64% by wt. of n-propanol, 24% by wt. of Glycydoxylpropyltrimethoxysilane (Glymo), 7% by wt. of water, and 5% by wt. of hydrochloric acid. These ingredients were mixed for 24 hours. The coating solution was prepared by using 21% by wt. of polymeric solution, 7% by wt. colloidal silica in methyl ethyl ketone (MEK-ST) with 15 nm particle size particles supplied by Nissan Chemicals Inc., and 72% by wt. n-propanol. This solution was stirred for 2 hours to provide a silica sol (also sometimes referred to herein as "the final solution"). The silica coating was fabricated using a spin coater operating at 1200 rpm for 30 sec. The coating was heated on a hot plate at 150 degrees C. for 2 minutes, then in an oven at 220 degrees C. for 2.5 minutes, and tempered in a furnace at 625 degrees C. for 3.5 minutes. The thickness of the coating was approximately 128.9 nm, and the transmission of the coating was 86.7%. The b* value, which is an indication of blue tint in the coating, was 1.1. The RMS roughness of the coating was 9.81 nm.

EXAMPLE 2

The silica sol for Example 2 was prepared as follows. A polymeric component of silica was prepared using 64% by wt. of n-propanol, 24% by wt. of Glycydoxylpropyltrimethoxysilane (Glymo), 7% by wt. of water, and 5% by wt. of hydrochloric acid. These ingredients were mixed for 24 hours. The coating solution was prepared by using 21% by wt. of polymeric solution, 7% by wt. colloidal silica in methyl ethyl ketone (MEK-ST-MS) with 25 nm particle size particles supplied by Nissan Chemicals Inc., and 72% by wt. n-propanol. This solution was stirred for 2 hours to provide a silica sol (also sometimes referred to herein as "the final solution"). The silica coating was fabricated using a spin coater operating at 1450 rpm for 30 sec. The coating was heated on a hot plate at 150 degrees C. for 2 minutes, then in an oven at 220 degrees C. for 2.5 minutes, and tempered in a furnace at 625 degrees C. for 3.5 minutes. The thickness of the coating was approximately 133.5 nm, and the transmission of the coating was 86.9%. The b* value, which is an indication of blue tint in the coating, was 0.9. The RMS roughness of the coating was 7.5 nm.

EXAMPLE 3

The silica sol for Example 3 was prepared as follows. A polymeric component of silica was prepared using 64% by wt. of n-propanol, 24% by wt. of Glycydoxylpropyltrimethoxysilane (Glymo), 7% by wt. of water, and 5% by wt. of hydrochloric acid. These ingredients were mixed for 24 hours. The coating solution was prepared by using 21% by wt. of polymeric solution, 7% by wt. colloidal silica in methyl ethyl ketone (MEK-ST-U) with 100 nm particle size particles supplied by Nissan Chemicals Inc., and 72% by wt. n-propanol. This solution was stirred for 2 hours to provide a silica sol (also sometimes referred to herein as "the final solution"). The silica coating was fabricated using a spin coater operating at 1000 rpm for 30 sec. The coating was heated on a hot plate at 150 degrees C. for 2 minutes, then in an oven at 220 degrees C. for 2.5 minutes, and tempered in a furnace at 625 degrees C. for 3.5 minutes. The thickness of the coating was approximately 130 nm, and the transmission of the coating was 87.1%. The b* value, which is an indication of blue tint in the coating, was 0.8. The RMS roughness of the coating was 5.6 nm.

In view of the descriptions provided above, it will be appreciated that the intermediate product comprising the substrate and the spin coated silica sol may be exposed to two or more temperature treatments. The first and second temperature treatments may at least partially cure the sol, whereas the third temperature treatment may heat treat (e.g., thermally temper) the substrate with the AR coating disposed thereon. Additionally, in certain example embodiments, each successive temperature may be at least as high or higher than the previous temperature(s).

As indicated above, certain example embodiments may be used in connection with standard clear glass. In certain instances, after coating, a similar transmission to that obtained with low iron glasses may be obtained. Thus, it will be appreciated that such example embodiments provide manufacturing flexibility and/or cost advantages (e.g., since high performance can be achieved using lower-grade materials). Also as indicated above, certain example embodiments may be used in connection with ExtraClear, UltraWhite, or Solar glass, commercially available from the assignee of the instant invention. In certain instances, after coating, the coated article would exhibit unusually high transmission performance.

As indicated above, the techniques of certain example embodiments may result in a number of advantages. For example, the coating derived from colloidal silica with large particles in accordance with certain example embodiments may show high transmission, high transmission gain with respect to an uncoated glass substrate, a high b* value indicative of an intense bluish tit (that often is desirable as a highly improved cosmetic quality of AR coatings), etc. The properties may be present in the annealed or heat treated (e.g., thermally tempered) state in certain example embodiments. Additionally, in certain example embodiments, the coatings may survive the high temperatures and harsh environments typically involved in heat treatment. For example, the coatings of certain example embodiments may survive temperatures of 500 degrees C. and higher.

It will be appreciated that the b* values noted herein refer to standard CIELAB coordinates. See, for example, U.S. Pat. No. 5,308,805, the entire disclosure of which is incorporated herein by reference. Such a technique is reported in CIE Publication 15.2 (1986) and ASTM: E.308-90 [Ill. C 2 degree observer].

The terms "heat treatment" and "heat treating" as used herein mean heating the article (with or without an AR coating) to a temperature sufficient to enabling thermal tempering, bending, and/or heat strengthening of the glass. This includes, for example, heating an article (with or without an AR coating) to a temperature of at least about 580 or 600 degrees C. for a sufficient period to enable tempering and/or heat strengthening, more preferably at least about 600 degrees C., and sometimes to 625 degrees C. In some instances, the HT may be for at least about 4 or 5 minutes. It is noted that the glass substrate(s) (with or without an AR coating) may be heat treated in certain example embodiments so that the glass substrate(s) (with or without an AR coating) is/are either heat strengthened or thermally tempered (e.g., at a temperature of at least about 580 degrees C., more preferably at least about 600 degrees C., and often at least about 620 or 640 degrees C.).

It will be appreciated that the example embodiments described herein may be used in connection with front electrode photovoltaic devices or back electrode photovoltaic devices. For example, certain example embodiments used herein may be used in connection with the photovoltaic devices described in, for example, U.S. Publication Nos. 2008/0169021; 2009/0032098; 2008/0308147; and 2009/0020157; and application Ser. Nos. 12/285,374 and 12/285,890 (the disclosures of which are each incorporated herein by reference).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article, the method comprising:
   providing a glass substrate;
   preparing a sol, the sol comprising colloidal silica having a particle size of 10-110 nm;
   spin coating the sol, directly or indirectly, onto the glass substrate;
   curing the sol to form a silica-inclusive anti-reflective (AR) coating, wherein the curing comprises exposing the substrate together with the sol spin coated thereon to first and second elevated temperatures, the second elevated temperature being higher than the first elevated temperature, wherein the substrate together with the sol spin coated thereon is exposed to a temperature of about 150 degrees C. for 2 minutes, followed by a temperature of about 220 degrees for 2.5 minutes; and
   heat treating the glass substrate together with the AR coating at a temperature of at least about 500 degrees C., wherein, post heat treatment, the AR coating has a b* value of 0.8 or greater.

2. The method of claim 1, wherein the particle size is 20-100 nm.

3. The method of claim 2, wherein post heat treatment, the AR coating has a b* value of 0.9 or greater.

4. The method of claim 2, wherein post heat treatment, the AR coating has a b* value of 1 or greater.

5. The method of claim 1, wherein the preparing of the sol comprises:
   preparing a polymeric component, the polymeric component comprising n-propanol, Glycydoxylpropyltrimethoxysilane (Glymo), water, and hydrochloric acid;
   mixing the polymeric component;
   forming a coating solution by combining the polymeric solution with the colloidal silica in methyl ethyl ketone; and
   stirring the coating solution to form the sol.

6. The method of claim 1, further comprising building the glass substrate together with the AR coating into a photovoltaic device.

* * * * *